United States Patent
Kakeshita et al.

(10) Patent No.: US 6,800,143 B1
(45) Date of Patent: Oct. 5, 2004

(54) SUPERMAGNETOSTRICTIVE ALLOY AND METHOD OF PREPARATION THEREOF

(75) Inventors: Tomoyuki Kakeshita, Suita (JP); Takashi Fukuda, Kusatsu (JP); Tetsuya Takeuchi, Osaka (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/204,408

(22) PCT Filed: Jul. 17, 2000

(86) PCT No.: PCT/JP00/04806

§ 371 (c)(1),
(2), (4) Date: Nov. 21, 2002

(87) PCT Pub. No.: WO01/64966

PCT Pub. Date: Sep. 7, 2001

(30) Foreign Application Priority Data

Feb. 29, 2000 (JP) ........................ 2000-058015

(51) Int. Cl.$^7$ ............................... H01F 1/00
(52) U.S. Cl. ..................... 148/121; 148/300; 148/430; 420/466
(58) Field of Search ............... 148/100, 120, 148/121, 300, 430; 420/466

(56) References Cited

U.S. PATENT DOCUMENTS

| | | | |
|---|---|---|---|
| 4,396,441 A | * 8/1983 | Masumoto et al. | 148/101 |
| 5,019,190 A | 5/1991 | Sawa et al. | 148/306 |
| 5,192,375 A | 3/1993 | Sawa et al. | 148/306 |
| 5,562,004 A | 10/1996 | Kaise et al. | 73/862.336 |

FOREIGN PATENT DOCUMENTS

| | | |
|---|---|---|
| EP | 0 1640200 | * 12/1985 |
| JP | 62-170453 | 7/1987 |
| JP | 7-335414 | 12/1995 |
| JP | 7-335416 | 12/1995 |
| JP | 10-259438 | 9/1998 |
| JP | 11-509368 | 8/1999 |
| JP | 11-269611 | 10/1999 |

OTHER PUBLICATIONS

Hansen, Constitution of Binary Alloys, 1958, pp. 698–700.*
Journal of Alloys and Compounds, vol. 258, Nos. 1–2, Aug. 1, 1997, Contents (Discussed in the specification).
Industrial Materials vol. 45, No. 12, Nov. 1997, pp108–111 (Discussed in the specification).

* cited by examiner

Primary Examiner—John P. Sheehan
(74) Attorney, Agent, or Firm—Westerman, Hattori, Daniels & Adrian, LLP

(57) ABSTRACT

The present invention provides a supermagnetostrictive alloy capable of providing a larger shift (lager magnetostriction) with excellent workability, which is applicable to an actuator in response to advances in downsizing of electronic devices and upgrading of medical instruments and production apparatuses. The supermagnetostrictive alloy has a degree of order of 0.6 to 0.95 achieved by subjecting $Fe_{3-x}Pt_{1+x}(-0.02 \leq x \leq 0.2)$ to a heat treatment. The present invention also provides a method for the preparation of a supermagnetostrictive alloy having a magnetostriction of 0.3% or more, particularly 0.5% or more, comprising the steps of subjecting the $Fe_{3-x}Pt_{1+x}$ alloy of a raw material to a homogenization annealing, and then subjecting the resulting product to a heat treatment at 700 to 1000 K for 0.5 to 600 hours.

5 Claims, 3 Drawing Sheets

SUPERMAGNETOSTRICTIVE ALLOY AND METHOD OF PREPARATION THEREOF

TECHNICAL FIELD

The present invention relates to a supermagnetostrictive alloy or a magnetic alloy capable of exhibiting a giant magnetostriction through a phase transformation, and a method for preparation thereof.

BACKGROUND ART

A functional material usable as a member for generating a shift (magnetostriction) and a force (stress) is referred to as actuator, which is used in a wide range of fields such as electronic devices, medical instruments and production apparatuses. Such a functional material includes a piezoelectric material, a magnetostrictive material, a shape-memory material and others. One of notable magnetostrictive materials is a rare-earth alloy $Tb_{0.3}Dy_{0.7}Fe$ (Journal of Alloys and Compounds, vol. 258, 1997), which has been commercialized (Trade Name: Terfenol-D). Terfenol-D has a maximum magnetostriction of 0.17%.

Japanese Patent Laid-Open Publication No. 11-269611 discloses a Fe/Pt-based or Fe/Pd-based rapidly solidified alloy having a magnetostriction of 0.15 to 0.2%. Further, $Ni_2MnGa$ is known as a shape-memory alloy whose crystal state is changed by magnetic field or electric field to provide a high-speed activation (Industrial Materials Vol. 45, No. 12, Nov. 1997, pp 108–111, Japanese Patent Laid-Open Publication No. 10-259438). However, this shape-memory alloy has mechanical brittleness and poor workability. Japanese Patent Laid-Open Publication No. 62-170453 discloses another shape-memory alloy which contains 25–30 at % of Pt added into Fe and has an irregular atomic arrangement to provide enhanced workability. Japanese domestic publication of PCT application in Japanese language No. 11-509368 discloses a method for controlling a material having a twin structure to cause change in shape and generate movement and/or force in the material by applying to the material a magnetic field having a directionality and magnitude suitable for achieving a desired reorientation of the twin structure.

Problem to be Solved by the Invention

In line with advances in downsizing of electronic devices and upgrading of medical instruments and production apparatuses, it is desired to achieve an actuator made of a material capable of providing a larger shift (lager magnetostriction) with excellent workability.

DISCLOSURE OF THE INVENTION

Means for Solving the Problem

With focusing on a phase transformation in an alloy structure, the inventors has successively achieved a magnetostriction of 0.3% or more, particularly 0.5% or more by subjecting $Fe_{3-x}Pt_{1+x}$ ($-0.02 \leq x \leq 0.2$) to a heat treatment under inventive conditions for ordering.

Specifically, the present invention is directed to a supermagnetostrictive alloy having a degree of order of 0.6 to 0.95 achieved by subjecting $Fe_{3-x}Pt_{1+x}$ ($-0.02 \leq x \leq 0.2$) to a heat treatment. Even if the ordering is performed to a $Fe_{3-x}Pt_{1+x}$ alloy having less than −0.02 or greater than 0.2 of x, no FCC-FCT martensitic transformation is caused. A preferable range of x is $0.0 \leq x \leq 0.1$.

Further, the present invention is directed to a method for the preparation of the above supermagnetostrictive alloy comprising the steps of subjecting a $Fe_{3-x}Pt_{1+x}$ ($-0.02 \leq x \leq 0.2$) alloy of a raw material to a homogenization annealing, and then subjecting the resulting product to a heat treatment at 700 to 1000 K for 0.5 to 600 hours. Given that when all of Pt and Fe in $Fe_3Pt$ having a face-centered structure are accurately arranged at corners and face-centers of the crystal structure, respectively, such a state is defined as a fully ordered state or the degree of order S=1, a maximum magnetostriction could be achieved by arranging the degree of order in the range of 0.6 to 0.95. When the degree of order is less than 0.6 or greater than 0.95, no FCC-FCT martensitic transformation is caused.

The alloy of the present invention exhibits an extremely large magnetostriction of 0.5% even under a weak magnetic field of about 4 T. As for magnetostrictive alloys, by extension of a conventional conception in which spins are coordinated with each other in a magnetic domain, an obtainable magnetostriction $\Delta l/l$ is the order of $10^{-6}$ at utmost. One of the main reasons for the extremely large magnetostriction of 0.5% ($5 \times 10^{-3}$) in the present invention is that a crystallographic domain (variant) is conformed to a magnetic domain to form a single domain and thereby spin axes are crystallographically coordinated with each other as well.

The present invention provides an alloy having excellent workability and thereby the alloy can be formed in a single crystal bulk, polycrystal bulk, thin sheet shape (including roll shape), linear shape, thin film shape or the like. The present invention can also provide a shape-memory alloy in which the crystallographic domain (variant) and magnetic domain are approximately equalized in size and aligned in the direction of an applied magnetic field.

BEST MODE FOR CARRYING OUT THE INVENTION

In the present invention, a $Fe_{3-x}Pt_{1+x}$ ($-0.02 \leq x \leq 0.2$) alloy as a raw material or un-heat-treated material can be prepared through a single crystal production method, a casting method, a sputtering method or the like. The raw material is subjected to a homogenization annealing at about 1200 to 1700 K, and the homogenization-annealed raw material is cut into a given shape. Then, the raw material is subjected to a solution treatment at about 1200 to 1700 K to remove the distortion due to the cutting. For an ordering, the solution-treated raw material is then enclosed in a silica tube which is held with vacuum or filled with Ar gas to prevent oxidation of the raw material, and is heated at 700 K to 1000 K, preferably 800 K to 900 K for 0.5 to 600 hours., preferably 1 to 96 hours.

Any suitable speed may be selected to heat the raw material up to the ordering temperature and cool the heated material down from the ordering temperature. The heated material may be cooled down by either one of air-cooling and water-cooling (for example, a process of immersing into water having a temperature of 20° C.). The product of the ordering temperature x the ordering time is adjusted to obtain a desired degree of order S ranging from 0.6 to 0.95. When the raw material is prepared through the casting method, it is desired to forge or roll the raw material so as to coordinate the crystal orientation. In an alternative embodiment, an iron-platinum alloy may be deposited on a substrate heated up to 770 to 1000 K.

Figure 1:
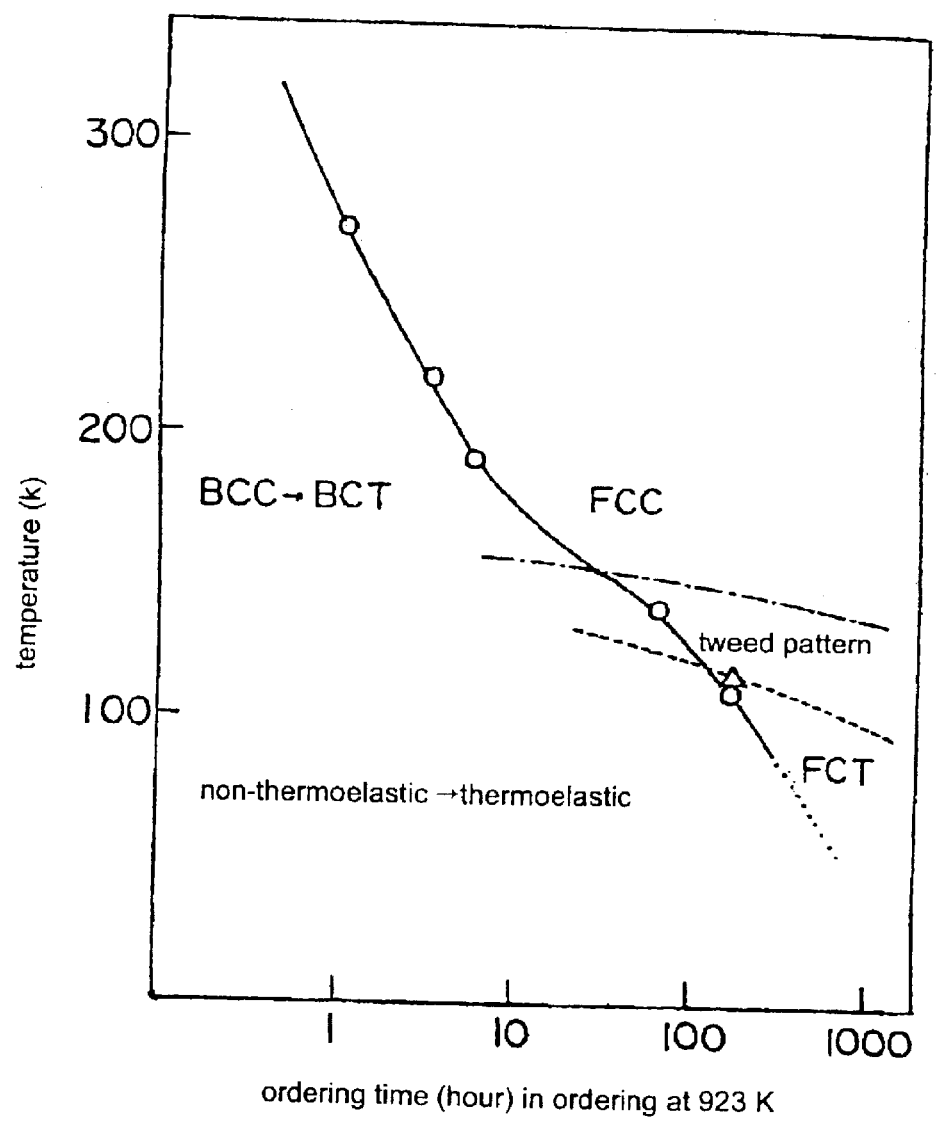
FIG. 1 is a graph showing a phase transformation based on an ordering time as a function.

Through the ordering, the crystal structure of the raw material is changed from a face-centered cubic (FCC) structure to a face-centered tetragonal (FCT) structure. Thus, the degree of order can be detected by an X-ray analysis. FIG. 1 is a graph showing a phase transformation based on an ordering time in the ordering at 923 K. FIG. 1 shows that a martensitic transformation (Ms) temperature of BCT martensite (solid line) and FCT martensite (broken line) and an initiation temperature of the formation of a tweed pattern in the crystal structure depend on the ordering time. The FCT region shown on the lower right side of FIG. 1 corresponds to the alloy of the present invention having a degree of order of 0.6 to 0.95.

FIRST EXAMPLE

A $Fe_3Pt$ single crystal bulk alloy was prepared through Floating Zone method and processed as follows.
(1) Melting: 26 g of iron and 30 g of platinum were molten in an arc-melting furnace to provide an iron/platinum atomic ratio of 3:1.
(2) Single-Crystallization: Using a four-ellipsoidal-mirror type Floating Zone melting apparatus, the molten iron/platinum was single-crystallized through Floating Zone method to obtain a $Fe_3Pt$ single crystal bulk of 56 g.
(3) Homogenization Annealing: Using an electric furnace, the $Fe_3Pt$ single crystal bulk was heated at a constant temperature of 1373 K for 24 hours, and then slowly cooled.
(4) Cutting: The heat-treated single crystal bulk was cut into a cube having a side of 2 mm. The crystal orientation of the cut single crystal bulk was checked through a Laue method and adjusted to match the direction of [001] with the direction of a magnetic field.
(5) Enclosing in Silica Tube; Then, the cut single crystal bulk was enclosed in a silica tube having a diameter of 10 mm and a length of 50 mm.
(6) Solution Treatment: In order to remove the distortion due to the cutting, the single crystal bulk was heated at a constant temperature of 1373 K for 1 hour in the silica tube held with vacuum or filled with Ar gas, and then slowly cooled.
(6) Ordering: Using an electric furnace, the single crystal bulk was heated at a constant temperature of 923 K for 12 hours.
(7) Cooling: After heating, the single crystal bulk was air-cooled.

Measurement of Magnetostriction: The thermal expansion and magnetostriction were measured by detecting change of the distance between two planes through a capacity measurement. A three-terminal capacitance method was used for the capacity measurement. For the single crystal of two cubic millimeters, the thermal expansion and magnetostriction were measured while matching the direction of [001] with the direction of a magnetic field.

Figure 2:
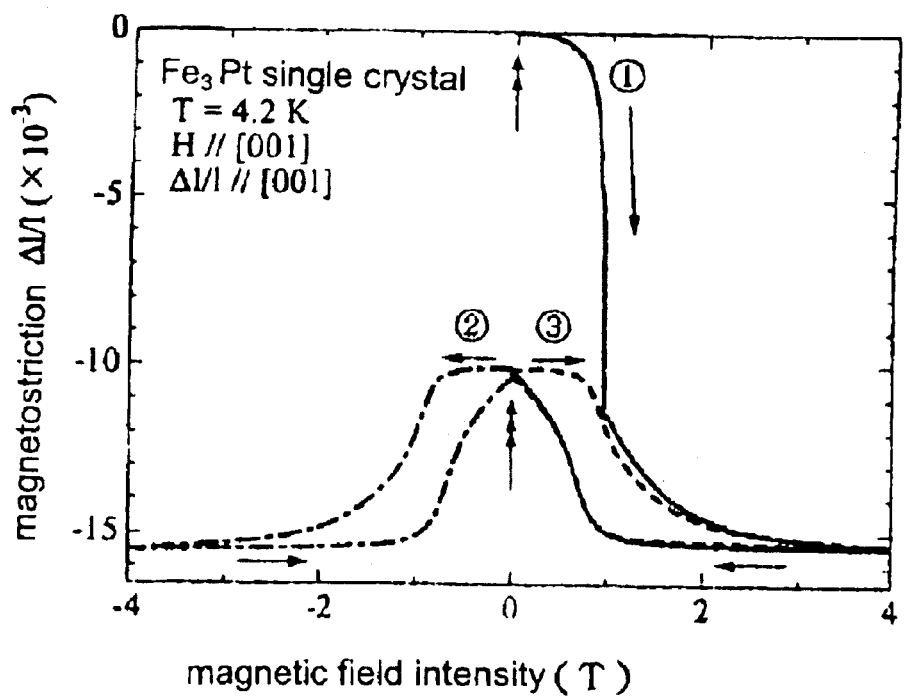
FIG. 2 is a graph showing the relationship between an applied magnetic field and a magnetostriction of a $Fe_3Pt$ single crystal in a first example.
Figure 3:
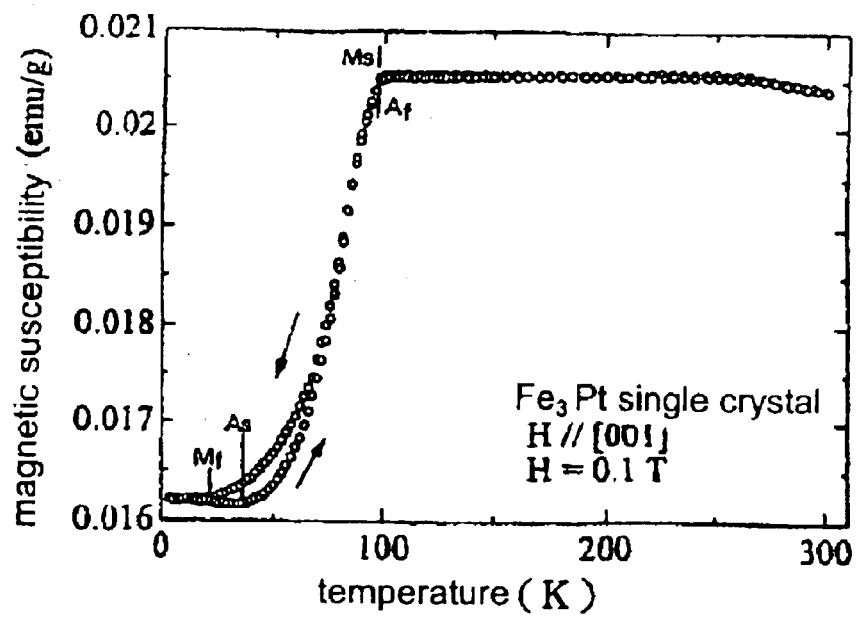
FIG. 3 is a graph showing a temperature dependence of the magnetic susceptibility of the $Fe_3Pt$ single crystal in the first example.
Figure 4:
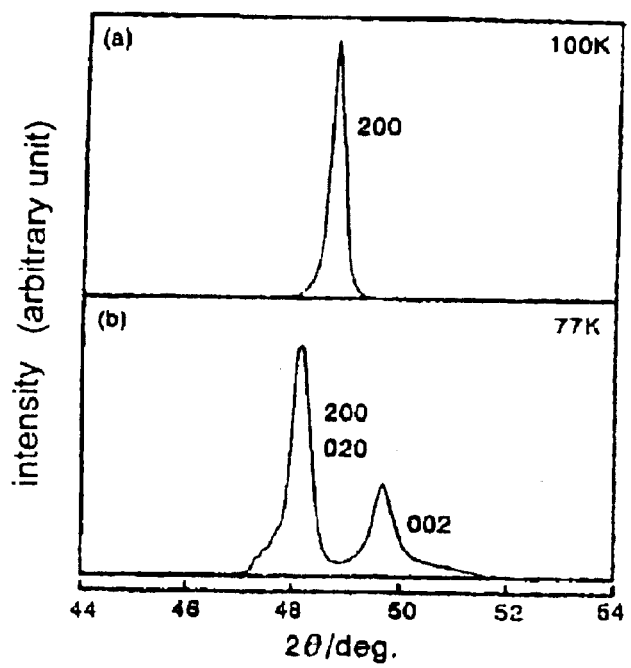
FIG. 4 is a diagram showing X-ray profiles of the $Fe_3Pt$ single crystal in the first example at 77 K and 100 K.
Figure 5:
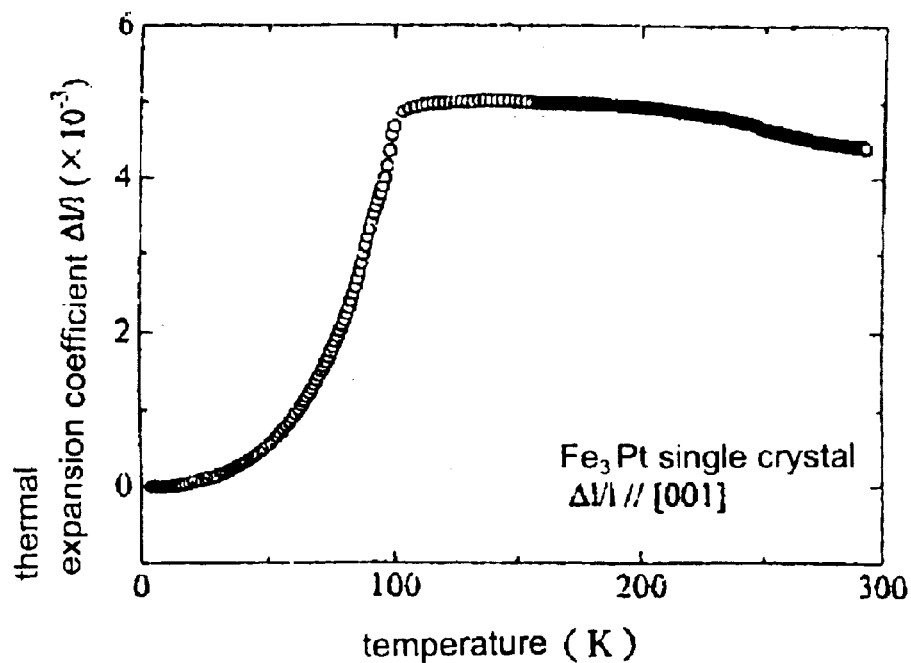
FIG. 5 is a graph showing a temperature dependence of the thermal expansion coefficient of the $Fe_3Pt$ single crystal in the first example.

FIG. 2 shows the measurement result. The magnetic field intensity (T) was changed from 0 T to 4 T as shown by the code ① (solid line), from 4 T to 0 T as shown by the code ② (one-dot chain line), and from 0 T to −4 T and further to 0 T as shown by the code ③ (two-dot chain line). As can be seen from FIG. 2, the $Fe_3Pt$ single crystal of the present invention exhibits a magnetostriction of $5 \times 10^{-3}$. This value is equivalent to three-times of that of conventional examples. FIG. 3 shows a temperature dependence of the magnetic susceptibility, and FIG. 4 shows X-ray profiles at 77 K and 100 K. Based on FIGS. 3 and 4, the number of domains and their magnetostrictions can be calculated, and these calculated values are consistent with the measurement result. FIG. 5 is a graph showing a temperature dependence of the thermal expansion coefficient. As can be seen from FIG. 5, a shape change of $5 \times 10^{-5}$ is exhibited, and three variants are introduces.

SECOND EXAMPLE

A $Fe_3Pt$ polycrystal bulk sheet-shaped alloy was prepared through a casting method and processed as follows.
(1) Melting: The same molten metal as that in the first example was solidified in a water-cooled copper crucible to obtain a $Fe_3Pt$ polycrystal bulk having a size of 30×20×10 millimeter.
(2) Rolling: The polycrystal bulk was rolled through a single-roll drive rolling method to form a sheet-shaped sample having a thickness of 1 mm.
(3) Homogenization Annealing: This step and subsequent steps are the same as those in the first example.

The magnetostriction of the obtained alloy was $3 \times 10^{-3}$.

THIRD EXAMPLE

A $Fe_3Pt$ polycrystal alloy was prepared through a spattering method and processed as follows.
(1) Spattering: Using a magnetron-spattering apparatus, an alloy having a composition of $Fe_3Pt$ as a target was spattered on a substrate to provide an iron/platinum atomic ratio of 3:1. Then, a $Fe_3Pt$ alloy film having a thickness of 0.001 mm was obtained from the deposited film peeled from the substrate.
(2) Homogenization Annealing: This step and subsequent steps are the same as those in the first example.

The magnetostriction of the obtained alloy film was $3 \times 10^{-3}$.

INDUSTRIAL APPLICABILITY

The magnetostrictive alloy of the present invention exhibits an extremely large magnetostriction of 0.3% or more, particularly 0.5% or more, and has excellent workability. Thus, the alloy can be formed as various forms such as sheet members, foils, or wires. The alloy can also be formed as a thin film through a spattering method.

What is claimed is:
1. A method for the preparation of a supermagnetostrictive alloy having a degree of order of 0.6 to 0.95, said method comprising the steps of:
   subjecting a $Fe_{3-x} Pt_{1+x}$ alloy of a raw material to a homogenization annealing, where the range of x is $-0.02 \leq x \leq 0.2$, and
   subjecting the $Fe_{3-x} Pt_{1+x}$ alloy to a heat treatment at 700 to 1000 K for 0.5 to 600 hours.
2. The method for the preparation of a supermagnetostrictive alloy according to claim 1, wherein the heat treatment is at 800 to 900 K.
3. The method for the preparation of a supermagnetostrictive alloy according to claim 1, wherein the heat treatment is for 1 to 96 hours.
4. The method for the preparation of a supermagnetostrictive alloy according to claim 1, wherein the heat treatment is at 800 to 900 K for 1 to 96 hours.
5. The method for the preparation of a supermagnetostrictive alloy according to claim 1, wherein the homogenization annealing is at 1200 to 1700 K.

* * * * *